US006852567B1

(12) United States Patent
Lee et al.

(10) Patent No.: US 6,852,567 B1
(45) Date of Patent: Feb. 8, 2005

(54) METHOD OF ASSEMBLING A SEMICONDUCTOR DEVICE PACKAGE

(75) Inventors: Charles-Wee-Ming Lee, Singapore (SG); Helmut Strack, Munich (DE)

(73) Assignee: Infineon Technologies A.G., Munich (DE)

( * ) Notice: Subject to any disclaimer, the term of this patent is extended or adjusted under 35 U.S.C. 154(b) by 0 days.

(21) Appl. No.: 09/980,222

(22) PCT Filed: May 31, 1999

(86) PCT No.: PCT/SG99/00050

§ 371 (c)(1),
(2), (4) Date: Apr. 19, 2002

(87) PCT Pub. No.: WO00/74131

PCT Pub. Date: Dec. 7, 2000

(51) Int. Cl.$^7$ .......................... H01L 21/44; H01L 21/48; H01L 21/50
(52) U.S. Cl. .................. 438/106; 438/112; 438/123; 438/124; 438/127; 257/666; 257/788; 257/790
(58) Field of Search ................................. 438/106, 112; 257/784, 787

(56) References Cited

U.S. PATENT DOCUMENTS

| | | | |
|---|---|---|---|
| 4,486,945 A | * 12/1984 | Aigoo ........................ 438/123 |
| 4,821,148 A | * 4/1989 | Kobayashi et al. ......... 361/728 |
| 5,013,688 A | 5/1991 | Yamazaki et al. |
| 5,022,968 A | 6/1991 | Lin et al. |
| 5,031,821 A | * 7/1991 | Kaneda et al. ............ 228/110.1 |
| 5,098,796 A | 3/1992 | Lin et al. |
| 5,230,932 A | 7/1993 | Chen et al. |
| 5,250,363 A | 10/1993 | Chen |
| 5,343,073 A | 8/1994 | Parthasarathi et al. |
| 5,418,189 A | 5/1995 | Heinen |
| 5,449,951 A | * 9/1995 | Parthasarathi et al. ...... 257/677 |
| 5,573,845 A | 11/1996 | Parthasarathi |
| 5,622,898 A | * 4/1997 | Zechman .................... 438/127 |
| 5,633,529 A | * 5/1997 | Otsuki ........................ 257/666 |
| 5,897,339 A | 4/1999 | Song et al. |
| 6,013,109 A | * 1/2000 | Choi .......................... 438/124 |
| 6,046,507 A | * 4/2000 | Hatchard et al. ........... 257/790 |
| 6,107,690 A | * 8/2000 | Courtenay et al. .......... 257/787 |
| 6,368,899 B1 | * 4/2002 | Featherby et al. .......... 438/127 |
| 2002/0113322 A1 | * 8/2002 | Terashima et al. .......... 257/784 |

FOREIGN PATENT DOCUMENTS

| | | | |
|---|---|---|---|
| GB | 2105107 | * | 3/1983 |
| JP | 2-44738 | | 2/1990 |
| JP | 10251777 | | 9/1998 |

OTHER PUBLICATIONS

Lee et al., An Analytical Characterization and Reliability Testing of an Adhesion Enhancing Zn–Cr Leadframe Coating for Popcorn Prevention, 1998 Electronic Components and Technology Conference, 6/98, 1154–1161.

Lee et al., Investigation of a Novel Leadframe Treatment for "Dry–Pack Free" Packaging, 1997 Electronic Components and Technology Conference, 1997, 1049–1060.

Parthasarathi et al., Leadframe Treatment to Prevent Delamination in Plastic Packages, 1995 IEPS Conference, 643–650.

* cited by examiner

Primary Examiner—John F. Niebling
Assistant Examiner—Angel Roman
(74) Attorney, Agent, or Firm—Senniger Powers

(57) ABSTRACT

A method of assembling a semiconductor device package includes first attaching a semiconductor device to a die-pad area of a leadframe. Electrical connections are then between electrical contact areas on the semiconductor device and electrical connection areas on the leadframe to form a device/leadframe assembly. An adhesion enhancing coating is then deposited on the exposed surface of the device frame/leadframe assembly before encapsulating the coated device leadframe assembly in an electrically insulating material.

10 Claims, 2 Drawing Sheets

METHOD OF ASSEMBLING A SEMICONDUCTOR DEVICE PACKAGE

BACKGROUND OF THE INVENTION

The invention relates to a method of assembling a semiconductor device package and in particular, a method of assembly which minimises or prevents delamination at interfaces within the assembled package.

Plastic surface mount semiconductor device packages are susceptible to cracking during solder reflow and this phenomenon is commonly referred to as "popcorn cracking". Popcorn cracking occurs because epoxy molding compounds used to encapsulate semiconductor devices are hygroscopic and readily absorb moisture from the environment. During solder reflow, high hydrothermal stresses are induced due to the combination of rapid vaporization of the absorbed moisture and mismatches in the coefficients of thermal expansion between dissimilar materials in the package. Once the stress level reaches a critical threshold, delamination occurs, usually at the weakest interface, followed by the build-up of vapour pressure in the delaminated cavity forming a characteristic dome-shaped bulge. This leads finally to cracking of the encapsulation material.

Popcorn cracking is a potential reliability problem as the delaminated areas and/or cracks can induce corrosion failures, alter the thermal performance of power devices, and affect the stress distribution and concentration.

The molding compound/die-pad interface is known to be susceptible to delamination and the source of most popcorn failure modes. The situation is aggravated with the emergence of larger and thinner packages. Moreover, moisture can degrade the polymer/metal interfacial durability, and decrease the fracture toughness of the molding compound at reflow temperatures. Furthermore, the oxidation of copper-based leadframe materials during the assembly process can result in poor adhesion between the molding compound and die-pad. The main cause of poor adhesion has been attributed to the weak copper oxide layer on the leadframe surface. Studies have reported that the adhesion strength between the molding compound and the copper leadframe decreases with increasing oxide thickness.

Various techniques to enhance molding compound/die-pad adhesion have been suggested as possible solutions to prevent popcorn cracking. However, most of the solutions which have been proposed do not eliminate the problem of popcorn cracking completely and are either not economically viable and/or feasible to implement in mass production.

For example, organic adhesion promoters such as silane coupling agents are widely used in die-attach adhesives and molding compounds to improve adhesion at the various interfaces. However, they are temperature sensitive and susceptible to degradation at elevated temperatures (typically greater than 200° C.), for example, during wire bonding.

Use of an inorganic zinc-chromium (Zn—Cr) leadframe coating (commercially known as "Olin A2" and supplied by Olin Metal Research Laboratories) is believed to be effective in eliminating popcorn cracking. However, the Zn—Cr coating is deposited on the leadframe electrolytically via an electroplating process. However, due to the temperature stability of the Zn—Cr coating layer, it can prevent or interfere with subsequent solid-state bonding, fusion or soldering processes such as wire bonding, etc. Therefore, it is necessary to either mask the bonding/soldering areas during the coating process or to subsequently strip the coating from these areas. Therefore, there are surfaces of the leadframe and semiconductor device in the finished package which do not have the Zn—Cr coating and are still prone to popcorn cracking.

Chip buffer coatings such as polyimides, are commonly used to minimise thermo-mechanical stresses and delamination at the mold compound/chip interface. However, polyimides have the disadvantage that they have a tendency to absorb moisture and therefore, further contribute to popcorn cracking.

BRIEF SUMMARY OF THE INVENTION

In accordance with a first aspect of the present invention, a method of assembling a semiconductor device package comprises:

(i) attaching a semiconductor device to a die-pad area of a leadframe;

(ii) forming electrical connections between electrical contact areas on the semiconductor device and electrical contact areas on the leadframe to form a device/leadframe assembly;

(iii) depositing an adhesion enhancing coating on exposed surfaces of the device/leadframe assembly; and (iv) encapsulating the coated device/leadframe assembly in an electrically insulating material.

In accordance with a second aspect of the present invention, a semiconductor device package comprises a leadframe; a semiconductor device attached to a first portion of the leadframe; electrical connections extending from electrical contact areas on the semiconductor device to electrical contact areas on a second portion of the leadframe; an adhesion enhancing coating on surfaces of the leadframe, the electrical connections and the semiconductor device; and an electrically insulating material encapsulating the semiconductor device, the electrical connections and the first and second portions of the leadframe.

An advantage of the invention is that by depositing an adhesion enhancing coating on the leadframe and semiconductor device after the electrical connections are formed between the semiconductor device and the leadframe, the adhesion enhancing coating is also deposited on the electrical connections between the semiconductor device and the leadframe. There is also the advantage that if the adhesion enhancing coating is deposited electrolytically via an electroplating process, the electrical connections provide a conduction path from the leadframe to the semiconductor device to enable electrolytic deposition of the adhesion enhancing coating on electrically conducting surfaces of the semiconductor device.

Preferably, the adhesion enhancing coating is a metallic coating and is typically deposited electrolytically via an electroplating process.

Preferably, the metallic coating is an inorganic Zn—Cr coating, such as Olin A2.

Typically, the semiconductor device may be attached to the leadframe by an epoxy die-attach adhesive or with solder die-attach.

Preferably, the semiconductor device package is a surface mount semiconductor device package.

An example of a method of assembling a semiconductor device package in accordance with the invention will now be described with reference to the accompanying drawings, in which:

DETAILED DESCRIPTION OF THE INVENTION

Figure 1:
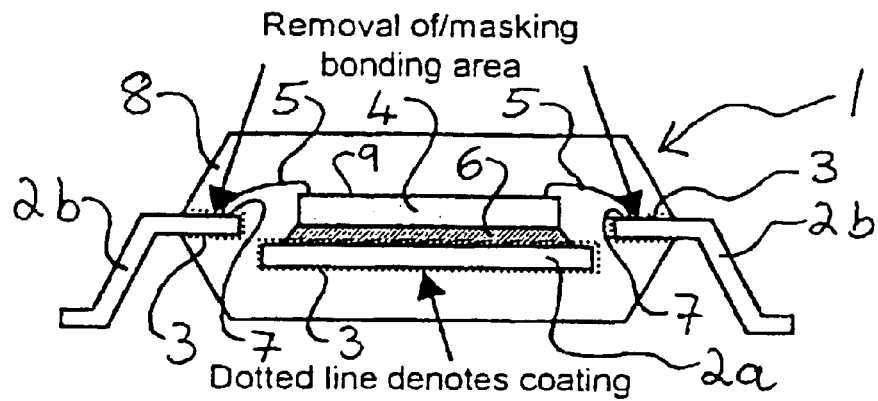
FIG. 1 is a cross-sectional view through a surface mount semiconductor device package having an adhesion enhancing coating in accordance with the prior art.

FIG. 1 is a cross-sectional view through a surface mount semiconductor device package 1 in which a leadframe 2, which comprises a die-pad area 2a and bonding leads 2b, has been coated with a Zn—Cr coating 3 (such as Olin A2) which is deposited on the leadframe electrolytically via an electroplating process prior to attachment of a semiconductor device 4 to the die-pad area 2a.

During deposition of the coating 3 it is necessary to either mask bonding areas 7 of the bonding leads 2b to which the wires 5 are to be bonded, or to carry out the deposition of the Zn—Cr coating 3 by a two step plate and strip process. Generally it is also necessary to mask or strip a portion of the die-pad area 2a to permit establishment of an electrical ground contact between the semiconductor device 4 and the die-pad area 2a.

After the masking has been removed from the leadframe 2, or the coating 3 has been stripped from the relevant areas, the semiconductor device 4 is attached to the die-pad portion 2a by an epoxy die-attach adhesive 6. The leadframe 2 with the semiconductor device 4 attached is then passed to a wire bonding process in which wires 5 are bonded between the bonding areas 7 on the bonding leads 2b and electrical contact areas on the semiconductor device 4.

Generally, the leadframe 2 is only one of a number of leadframes 2 which are joined together to form of a strip or matrix of leadframes 2. Each leadframe 2 on the strip or matrix comprises a die-pad area 2a and respective bonding leads 2b. Each die-pad area 2a on the leadframe 2 will have a semiconductor device 4 attached to it by a die-attach adhesive 6. Having the leadframes 2 in a strip or matrix which carries a number of semiconductor devices 4 permits easier handling of the leadframes 2 during assembly of the semiconductor device package 1.

After the wire bond process, the strip or matrix of leadframes 2 is passed to a molding process where an electrically insulating encapsulation material 8 is molded around the die-pad area 2a, bonding areas 7, semiconductor device 4 and wires 5 to leave only extremities of the bonding leads 2b protruding from the encapsulation material 8.

After the molding process, the leadframes 2 are singulated to separate each semiconductor device 4 and the respective die-pad area 2a and bonding leads 2b from adjacent semiconductor devices 4 and respective die-pad areas 2a and bonding leads 2b. Optionally, after the molding process, the coating can be removed from the extremities of the bonding leads 2b and/or from a protruding heat sink (if present).

There are a number of disadvantages associated with this prior art coating process. In particular, the requirement to either mask portions of the leadframe 2 or to subsequently strip coating from areas such as the bonding areas 7 and the ground bond area on the die-pad area 2a. In addition, this prior art coating process cannot coat the surface of the semiconductor device 4. Hence, this conventional assembly method does not prevent delamination and subsequent popcorn cracking at interface 9 between the molding compound 8 and the semiconductor device 4.

Figure 2:
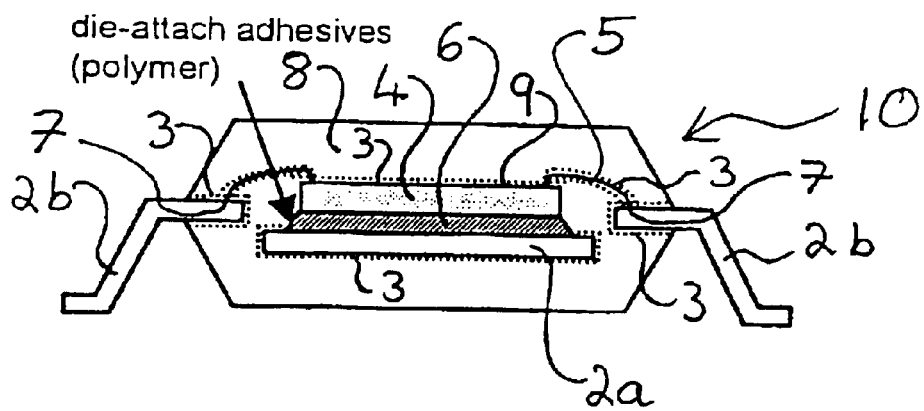
FIG. 2 is a cross-sectional view through a surface mount semiconductor device package in which a semiconductor device is attached to a leadframe with epoxy die-attach adhesive and incorporating an adhesion enhancing coating in accordance with the invention.

FIG. 2 shows a cross-sectional view of a semiconductor device package 10 which includes the same components as the semiconductor device package 1 and the same items are identified using the same reference numerals as in FIG. 1. However, the process for assembly of the semiconductor device package 10 is slightly different from that used for the semiconductor device package 1 shown in FIG. 1.

In the assembly of the package 10, the semiconductor device 4 is attached to the die-pad portion 2a by an epoxy die-attach adhesive 6 before the Zn—Cr coating 3 is deposited. As in the example described above, the leadframe 2 is initially one of a number of leadframes 2 joined together to form a strip or matrix. After the semiconductor device 4 has been attached to the die-pad portion 2a, the strip or matrix of leadframes 2 with the attached semiconductor devices 4 is passed to a wire bonding process for bonding of the wires 5 between contact areas on the semiconductor device 4 and the bonding areas 7 on the bonding leads 2b.

After the wire bonding process, the strip or matrix of leadframes 2, with the attached semiconductor device 4 and the wire bonds 5, is immersed in an electroplating bath and the Zn—Cr coating 3 is deposited electrolytically on the leadframe 2 in the areas shown, on the wire bonds 5 and electrically conducting surfaces on the semiconductor device 4 by an electroplating process.

After deposition of the Zn—Cr coating 3, the electrically insulating encapsulation material 8 is molded around the semiconductor devices 4, leadframes 2 and wire bonds 5, as in the prior art package 1. The strip or matrix of leadframes 2 is then singulated into individual semiconductor device packages.

Figure 3:
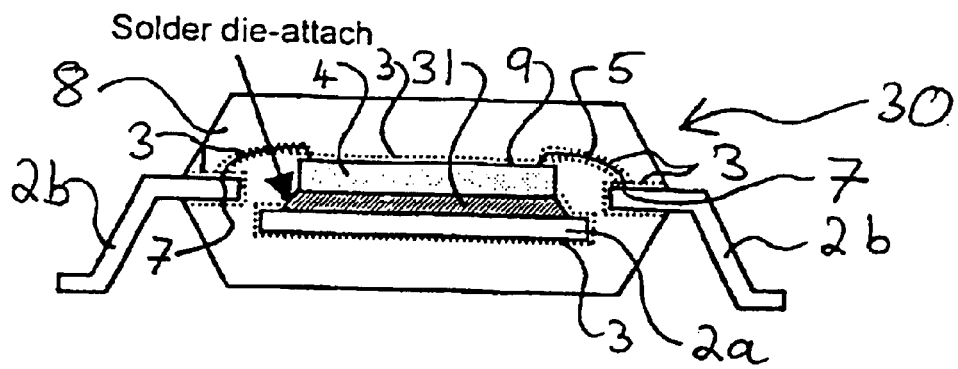
FIG. 3 is a cross-sectional view through a surface mount semiconductor package in which a semiconductor device is attached to a leadframe with solder and incorporating an adhesion enhancing coating in accordance with the invention.

FIG. 3 shows a semiconductor device package 30 which has been assembled using a process similar to that used for assembly of the semiconductor device package 10. However, the semiconductor device 4 is attached to the die-pad area 2a by solder 31. Therefore, as the solder 31 is electrically conducting, the Zn—Cr coating 3 is also deposited along the sides of the solder 31.

Figure 4:
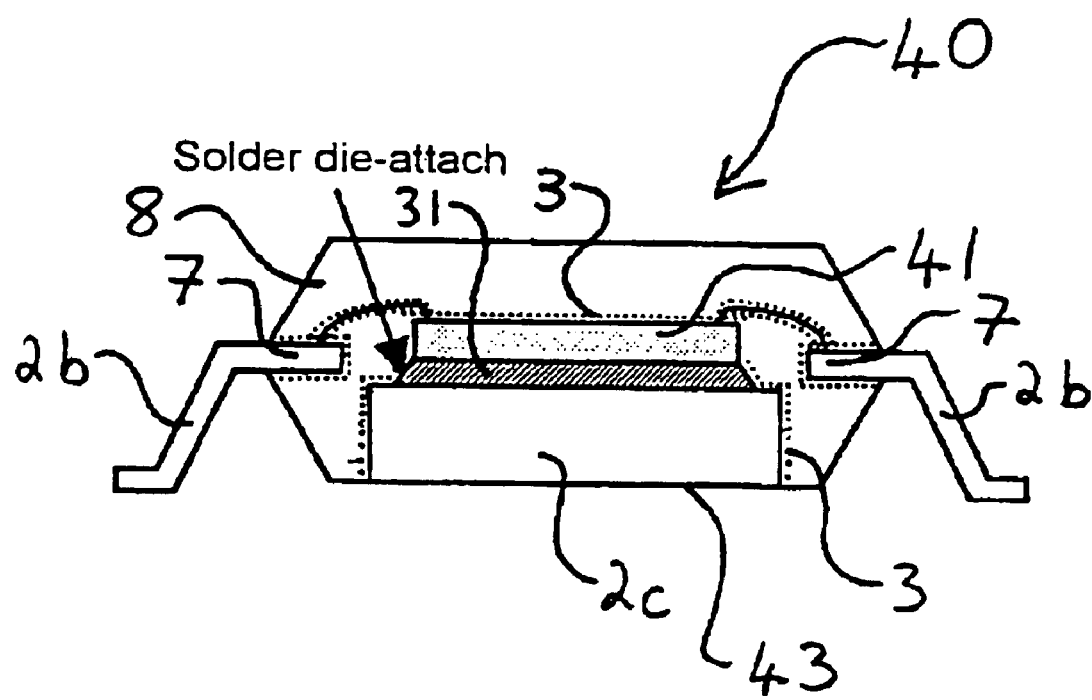
FIG. 4 is a cross-sectional view through a surface mount semiconductor package including a power semiconductor device with a protruding heat sink.

FIG. 4 shows a semiconductor device package 40 which has been assembled using a process similar to that used for assembly of the semiconductor device packages 10, 30. However, the package 40 includes a power semiconductor device 41 attached to a thickened die-pad area 2a by solder 31. Therefore, as the solder 31 is electrically conducting, the Zn—Cr coating 3 is deposited along the sides of the solder 31, as in the package 30. In addition, as a bottom surface 43 of the die-pad area 2c is not covered by the material 8, and the solder 31 is thermally conductive, the die pad area 2c acts as a heat sink for the device 41.

In the device packages 10, 30, 40, the coating is removed from non-encapsulated portions of the leadframe 2. In the packages 10, 30 the coating is removed from the non-encapsulated portions of the bonding leads 2b and in the package 40 the coating is removed from the non-encapsulated portions of the bonding leads 2b and the surface 43 of the die-pad area 2c. However, removal of the coating from these areas is not essential and is only a possible option.

By depositing the Zn—Cr coating 3 after attachment of the semiconductor devices 4, 41 to the die-pad areas 2a, 2c of the leadframe 2 and formation of the wire bonds 5, it is not necessary to mask any areas of the leadframe 2 during the coating process.

In addition, by depositing the coating 3 after wire bonding, but before molding, there is the advantage that the entire wire bonded assembly is submerged into the plating bath for coating deposition, and as the wires 5 establish electrical paths from the leadframe 2 to the electrical contact surfaces of the semiconductor device 4, the Zn—Cr coating 3 is also deposited on the electrical contact surfaces of the semiconductor device 4. The degree of coating coverage on the surface of the device 4 is dependent on the availability of electrically conducting paths on the surface. This is influenced by device design, distribution of metallisation, type of device passivation, provision of intrinsic/extrinsic passivation and provision of intrinsic/extrinsic electrical contact.

As an alternative to electrolytical deposition, it is possible that the coating could be deposited by a wet chemical catalytic process or a dry, physical/chemical deposition. In addition, although the deposition of a Zn—Cr coating has been described any metallic or non-metallic coating could be deposited using the invention.

What is claimed is:

1. A method of assembling a semiconductor device package comprises:
   (i) attaching a semiconductor device to a die-pad area of a leadframe;
   (ii) forming electrical connections between electrical contact areas on the semiconductor device and electrical contact areas on the leadframe to form a device/leadframe assembly;
   (iii) electrolytically depositing an adhesion enhancing coating by an electroplating process on the entire exposed surfaces of the device/leadframe assembly, the enhancing coating being in the form of an inorganic material comprising metal oxide; and
   (iv) encapsulating the coated device/leadframe assembly in an electrically insulating material.

2. A method according to claim 1, wherein the semiconductor device package is a surface mount semiconductor device package.

3. A method according to claim 1, further comprising, after encapsulating the coated device/leadframe assembly, removing the coating from non-encapsulated portions of the leadframe.

4. A semiconductor device package comprises a leadframe; a semiconductor device attached to a first portion of the leadframe; electrical connections extending from electrical contact areas on the semiconductor device to electrical contact areas on a second portion of the leadframe; an adhesion enhancing coating on the entire surfaces of the leadframe, the electrical connections and the semiconductor device; and an electrically insulating material encapsulating the semiconductor device, the electrical connections and the first and second portions of the leadframe, wherein the enhancing coating is in the form of an inorganic material comprising metal oxide.

5. A semiconductor device package according to claim 4, wherein the enhancing coating is an inorganic Zn—CR coating.

6. A semiconductor device package according to claim 4, wherein the semiconductor device is attached to the first portion of the leadframe by an adhesive.

7. A semiconductor device package according to claim 4, wherein the semiconductor device is attached to the first portion of the leadframe by solder.

8. A semiconductor device package according to claim 4, wherein the semiconductor device is a surface mount semiconductor device.

9. A semiconductor device package according to claim 4, wherein the semiconductor device is a power semiconductor device.

10. A semiconductor device package according to claim 4, wherein the first portion of the leadframe forms a heat sink for the semiconductor device and a surface of the first portion is not covered by the electrically insulating material.

* * * * *